United States Patent [19]

Noguchi et al.

[11] Patent Number: 4,865,945

[45] Date of Patent: Sep. 12, 1989

[54] POSITIVE PHOTORESIST MATERIAL WITH O-QUINONE DIAZIDE AND POLYMER CONTAINING SILICON ATOMS

[75] Inventors: Tsutomu Noguchi, Kanagawa; Keiichi Nito, Tokyo; Junetsu Seto, Kanagaw, all of Japan

[73] Assignee: Sony Corporation, Tokyo, Japan

[21] Appl. No.: 83,640

[22] Filed: Aug. 10, 1987

[30] Foreign Application Priority Data

Aug. 13, 1986 [JP] Japan ............................. 61-189821

[51] Int. Cl.$^4$ ............................................. G03C 1/60
[52] U.S. Cl. ................................... 430/192; 430/156; 430/165; 430/312; 430/313; 430/323; 430/326
[58] Field of Search ............... 430/192, 189, 193, 197, 430/270, 312, 313

[56] References Cited

U.S. PATENT DOCUMENTS

| | | | |
|---|---|---|---|
| 4,395,527 | 7/1983 | Berger | 430/189 |
| 4,510,227 | 4/1985 | Mohr et al. | 430/192 |
| 4,521,274 | 6/1985 | Reichmanis et al. | 430/312 |
| 4,587,196 | 5/1986 | Toukhy | 430/192 |
| 4,603,195 | 7/1986 | Babich et al. | 430/193 |
| 4,722,881 | 2/1988 | Ueno et al. | 430/156 |

FOREIGN PATENT DOCUMENTS

| | | | |
|---|---|---|---|
| 225801 | 8/1985 | German Democratic Rep. | 430/192 |
| 1367830 | 9/1974 | United Kingdom | 430/193 |

*Primary Examiner*—Charles L. Bowers, Jr.
*Attorney, Agent, or Firm*—Hill, Van Santen, Steadman & Simpson

[57] ABSTRACT

The present application describes a photoresist material which contains organo-silicon groups and the photoresist material is suitable for forming a micropattern applied in the fabrication of semiconductor integrated circuit and magnetic bubble memory elements. The photoresist material possesses high resistance to plasma etching using oxygen gas.

1 Claim, 2 Drawing Sheets

POSITIVE PHOTORESIST MATERIAL WITH O-QUINONE DIAZIDE AND POLYMER CONTAINING SILICON ATOMS

BACKGROUND OF THE INVENTION

1. Field of the Invention:

The present invention relates to a photoresist material which contains organo-silicon groups and is suitable for forming a micropattern applied in the fabrication of semiconductor integrated circuits and magnetic bubble memory elements. It more particularly relates to a photoresist material having a high resistance to plasma etching using oxygen gas.

2. Description of the Prior Art

In the fabrication of integrated circuits and bubble memory elements, dry etching using a gas plasma, an ion shower, or the like has been used in place of conventional wet etching since a photoresist pattern prepared by micropatterning can be accurately transferred to a substrate. For this reason, there is a need for a photoresist material having a high resistance to dry etching.

In order to obtain a high resolution from such a photoresist material, a three-layered photoresist has been proposed by J.M. Moran et al., in J. Vac. Sci. Technol., Vol. 16, 1620, (1979). The photoresist described there consists of a lower layer of a thick organic film, an intermediate layer of a silicon layer or a silicon oxide layer, and an upper layer of a thin organic film. However, this photoresist requires a complicated and prolonged etching process which is undesirable.

If a photoresist material having a good resistance to dry etching when emplying, for example, oxygen is used, such a material would also serve as the intermediate and upper layers of the three-layered structure. Therefore, the etching process can be considerably simplified.

Typical examples of such a material are photoresist materials having silicon atoms and described in Japanese Patent Laid-Open applications (Kokai) Nos. 60-196750; 60-119550; and 59-208542.

However, these photoresist materials are sensitive to electron beams and cannot be used with g-line steppers having a wavelength of 436 mm which presently constitute the most widely used exposure apparatuses.

It is also known that a polydimethylsiloxane has excellent resistance to an oxygen plasma and an etching rate of about 20Å/min. However, this polymer has the drawback that since it is liquid at room temperature, the fluidity of the polymer fails to provide high resolution, and the polymer is thus unsuitable for use as a photoresist material.

A polyacetylene-based photodecomposition type positive photoresist material such as a product available from Sanyo Kasei K.K. has been proposed as a silicon-based photoresist having a g-line absorption property. However, this photoresist material does not have a sufficiently high resolution or high sensitivity since the material is developed with the use of an organic solvent, and the throughput is low. This photoresist material is thus unsuitable for practical use.

SUMMARY OF THE INVENTION

The present invention provides a photoresist material containing organo-silicon units which can overcome the above described problems. In accordance with the present invention, there is provided a photoresist material which comprises a polymer containing at least one of the recurring units represented by the following general formula:

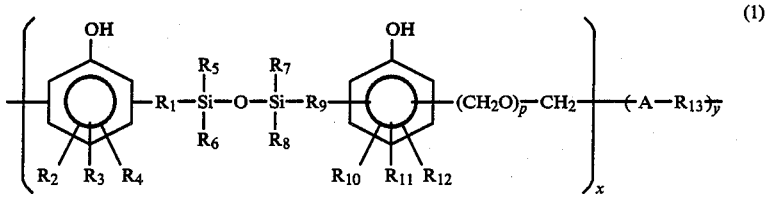

(1)

Wherein $R_1$ and $R_9$ each are lower alkylene groups preferably containing one to two carbon atoms; $R_2$, $R_3$, $R_4$, $R_{10}$, $R_{11}$ and $R_{12}$ each are H, OH, $CH_3$, or $CH_2OH$; $R_5$ to $R_8$ each are lower alkyl groups preferably containing 1 to 5 carbon atoms; $R_{13}$ is $CH_2$ or $CH_2OCH_2$; p is 0 or 1; A is phenol, a phenol derivative having substituents in the o-, m-, and/or p-positions relative to the hydroxyl group, or $$\underset{}{\text{OH}} \\ \bigcirc\!\!\!\!-R_{14}\!-\!\underset{R_{16}}{\overset{R_{15}}{\underset{|}{\overset{|}{Si}}}}\!-\!R_{17}$$

Wherein $R_{14}$ is a lower alkylene group preferably containing 1 to 2 carbon atoms, $R_{15}$, $R_{16}$ and $R_{17}$ each are lower alkyl groups preferably containing 1 to 5 carbon atoms; X is a value above 0 and below 1, and Y is in the range of 0 to $1-X$).

DESCRIPTION OF THE PREFERRED EMBODIMENTS

Figure 1:
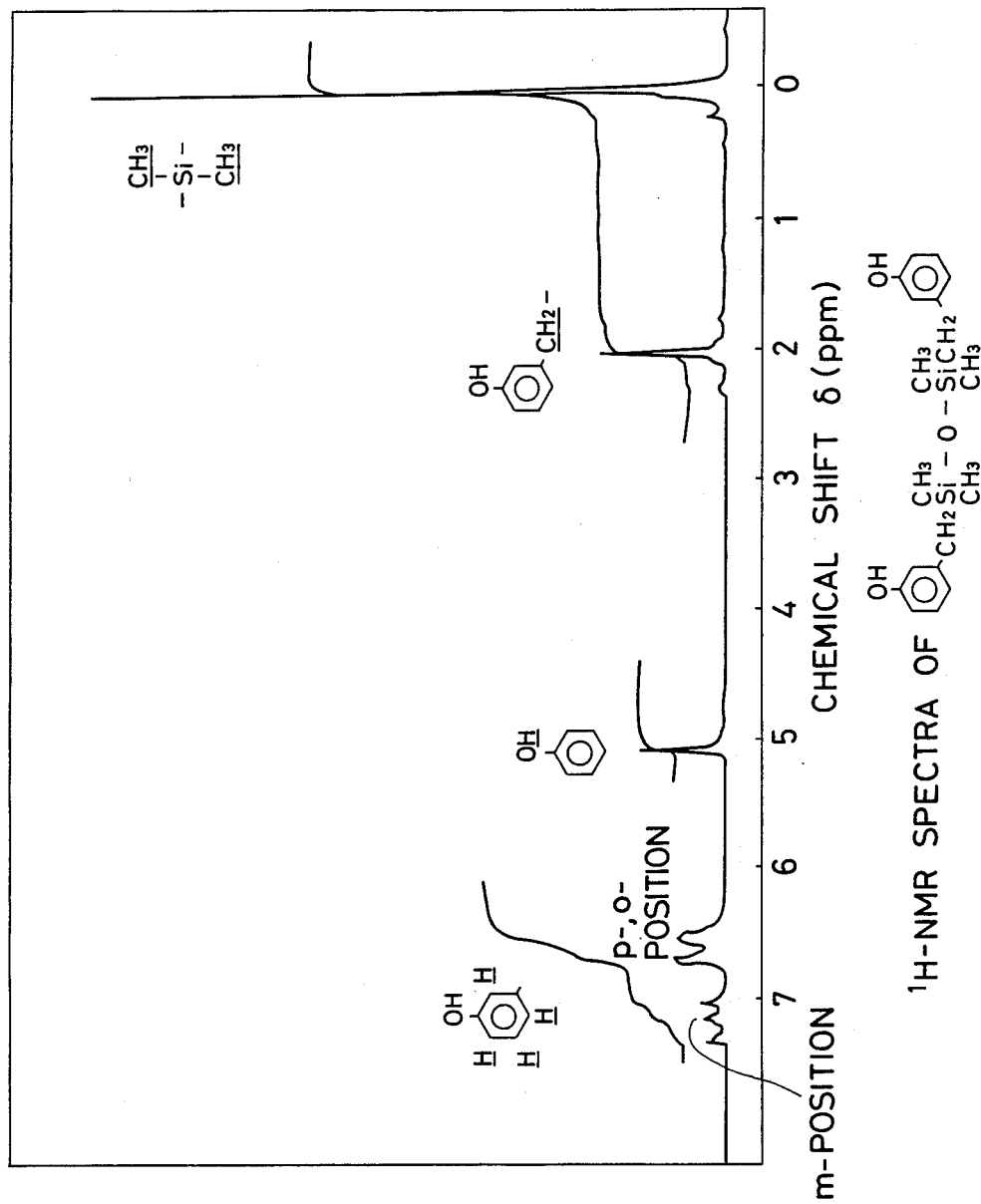
FIG. 1 is the $^1$H-NMR spectra of the monomers obtained in Examples 1 and 2.

Examples of the phenol derivative referred to as "A" in the preceding description in the photoresist material of the present invention can be o-, m-, and p-cresol, xylenol, and resorcinol. The ratio of X to Y in the above general formula can be arbitrarily determined. However, Y is preferably 0.7 or less to achieve proper developing properties of the photoresist material with respect to an aqueous solution of an organic base.

According to the present invention, the photoresist material produced with a composition described above has excellent sensitivity to UV light sources such as g- and i-lines. The photoresist material of the present invention can be developed with an aqueous solution of an organic base having the same lower swelling power during development as in a positive resist composed of a novolac resin-quinone diazide compound, the most commonly existing photoresist, thereby achieving a high resolution. In a dry etching process using oxygen, the new and improved positive photoresist material may comprise a phenol-based organo-silicon polymer resin and a quinone diazide compound. This positive resist has a higher resistance to etching than the conventional positive resist which includes a novolac resin.

The invention will now be described in more detail, together with a process for the production of the improved photoresist material by way of the following examples. These examples should not be construed as limiting the invention.

EXAMPLE 1

The following monomer was prepared, using the synthesis about to be described:

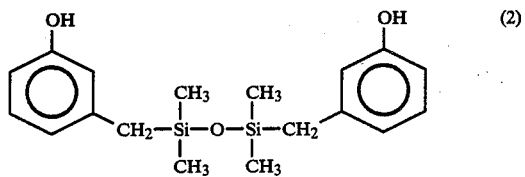 (2)

A mixture of 50 g (0.4 mol) of 3-hydroxybenzyl alcohol, 51 g (0.4 mol) of benzyl chloride, 110 g (0.8 mol) of anhydrous potassium carbonate, and 200 ml of anhydrous acetone refluxed for 6 hours in a 500 ml three neck distillation flask provided with a reflux condenser. The resulting benzyl ether compound was extracted with ether and dried with magnesium sulfate to provide a yield of 90%. 30 g (0.14 mol) of the resulting compound were dissolved in carbon tetrachloride. To the resulting solution 16.7 g (0.062 mo) of phosphorus tribromide were added dropwise and reacted for more than 2 hours while the solution was cooled with ice. The solution was then poured into iced water to decompose the unreacted compounds. The resulting bromide was refined by silica gel chromatography using n-hexane as a developing solvent. The yield was 60%. 1.93 g (0.079 g mol) of magnesium and 40 ml of anhydrous ether were charged into a 500 ml three neck distillation flask provided with a nitrogen blowing pipe, a reflux condenser, and a dropping funnel. 20 g (0.07 mol) of the bromide were dissolved in 100ml of anhydrous ether and the resulting solution was added dropwise into the flak over a period of 2 hours while cooling with ice. After about 2 additional hours of reaction, 6.6 g (0.07 mol) of dimethylchlorosilane were added dropwise. The resulting mixture was left to stand at room temperature for about 24 hours and then distilled under vacuum (0.6 mmHg, boiling point of 140° C.). The yield was 60%.

5 g (0.019 mol) of the resulting distilled product were added dropwise into ethanol in which 100 mg of a 5% palladium-carbon catalyst were dispersed. After the addition, 200 mg of the 5% palladium-carbon catalyst and several drops of concentrated hydrochloric acid were added to effect hydrogenation. The resulting product was refined using silica gel chromatography with n-hexane as the developing solvent to obtain a monomer represented by formula (2). The yield was about 100%.

The analytical values of the monomer are summarized as follows:

Infrared absorption spectrum (cm⁻1): 3350 (—OH); 2950 (CH$_2$—); 1250, 850, (Si-(CH$_3$)$_3$); 1050 (Si-O-Si);

$^1$H-NMR spectrum ($\delta$) ppm: 0.04 (12H, S, —CH$_3$)$_2$Si-); 2.08 (4H, S, —CHHD 2—); 5.16 (2H, S, —OH); 6.4 to 7.4 (8H, m, benzene nucleus (see FIG. 1).

Figure 2:
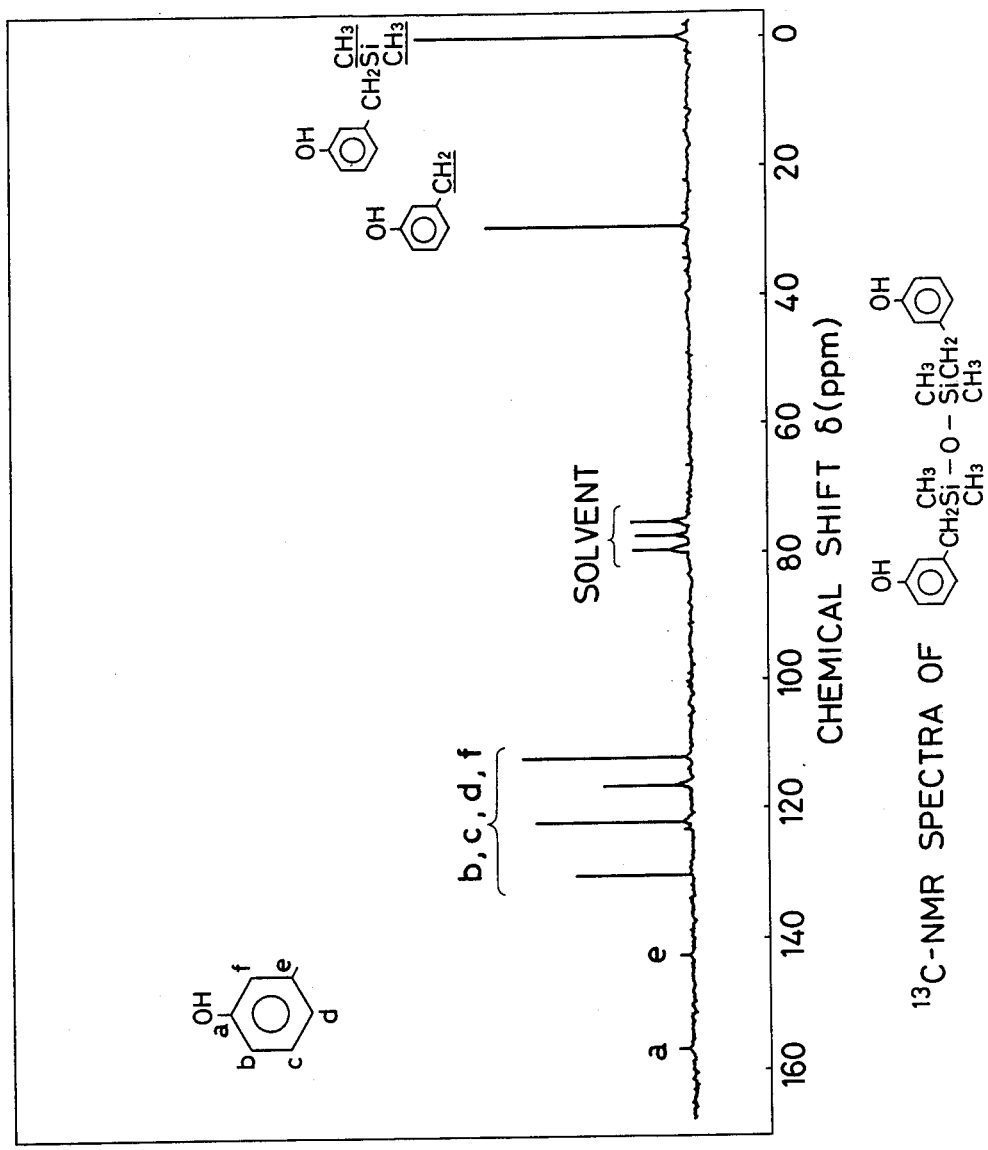
FIG. 2 is a $^{13}$C-NMR spectra of the same monomers.

$^{13}$C-NMR spectrum (see FIG. 2)

Precision molecular weight: calculated, 346.1447; found, 346.1474.

If a compound having substituent groups in the benzene nucleus is used in place of 3-hydroxybenzyl alcohol in the synthesis of the above monomer, the corresponding monomer can be obtained.

5.4 g (0.0156 mol) of the siloxane-based phenol monomer represented by the formula (2), 1.14 g of formalin (37% aqueous solution), 6 g of ethyl cellosolve acetate, and 27 mg of oxalic acid dihydrate were placed in a 100 ml flask and were heated and stirred at 110° C. for 8 hours. The resulting product was washed with water and refined under vacuum to obtain a photoresist material consisting essentially of a polymer represented by formula (3) below:

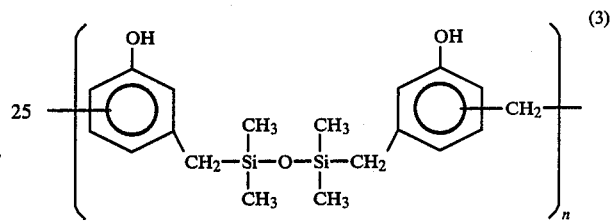 (3)

The molecular weight of the photoresist material measured according to gel permeation chromatography using a monodispersed polystyrene as a reference were $\overline{Mw}=5{,}200$ and $\overline{Mn}=1{,}100$, with a ratio $\overline{Mw}/\overline{Mn}=4.75$.

EXAMPLE 2

Following the same procedure as in Example 1, except using a heating and stirring time of 14 hours instead of 8 hours, a new photoresist material was obtained. The molecular weights of the photoresist material measured in the same manner as in Example 1 were $\overline{Mw}=28{,}300$ and $\overline{Mn}=2{,}200$ with a ratio $\overline{Mw}/\overline{Mn}=12.9$.

The analytical values of the polymersobtained in Examples 1 and 2 are summarized as follows:

Infrared absorption spectrum (cm⁻¹): 3300 (—OH); 2950 (—CH$_2$—); 1250, 850 (-Si(CH$_3$)2-); 1050 (-Si-O-Si-).

$^1$H-NMR spectrum ($\delta$) ppm: 0.04 to 0.2 (br, S—CH3);

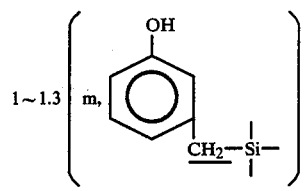 1~1.3 m,

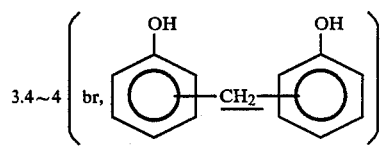 3.4~4 br, 6.2 to 6.8 (br, benzene nucleus).

In Examples 1 and 2, a small amount of a polymer having a recurring unit with a methylol group introduced into the benzene nucleus of the polymer represented by general formula (3) was also produced.

In Examples 1 and 2, when the polymerization reaction is performed in an alkaline solvent, a polymer represented by the following formula can be mainly produced in place of the polymer represented by formula (3).

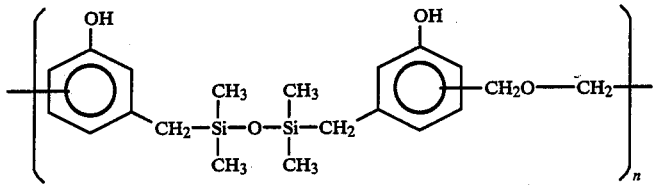

EXAMPLE 3

6 g (0.033 mol) of m-trimethylsilylmethylphenol, 5.71 g (0.0165 mol) of the siloxane-based phenol monomer obtained in Example 1 and represented by formula (2), 3.61 g of a 37% aqueous solution of formalin, 13 g of ethyl cellosolve acetate, and 87 mg of oxalic acid dihydrate were placed in a 100 ml flask and heated and stirred at 110° C. for 13 hours to obtain a photoresist material comprising a copolymer represented by general formula (4) below:

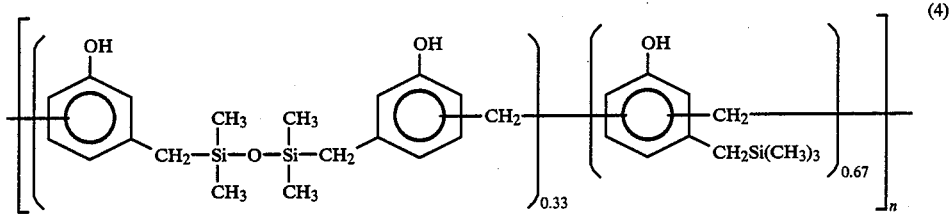

Following the same procedure as in Example 1, the molecular weights of the photoresist material were measured to be $\overline{Mw}=5,000$ and $\overline{Mn}=2,000$, with a ratio $\overline{Mw}/\overline{Mn}=2.5$. The analytical values of the copolymer were similar to those in Example 1.

The resistance of the polymers obtained in Examples 1 to 3 to reactive etching using oxygen was compared with the resistance of "Microposit 1400" a commercial material widely used in the art and available from Shipley Inc. The following results were obtained:

|  | Etching Rate (Å/min) |
| --- | --- |
| Polymer of Example 1 | 78 |
| Polymer of Example 3 | 66 |
| Commercially available product | 1,250 |

The etching was effected under an oxygen partial pressure of 10 mmHg, an oxygen flow rate of 50 SCCM, and an RF output of 0.1 W/cm².

The polymers obtained in Examples 1 to 3 thus have a higher resistance to etching using oxygen. The Mw values of the polymers range from about 3,000 to about 30,000.

The "Microposit 1400" was spin-coated on a silicon substrate to form a 2μm thick photoresist film. The photoresist film was baked on a hotplate at 200° C. for 20 minutes. A cellosolve acetate-xylene solution of the polymer obtained in Example 1 and combined with 15% by weight of a sensitizer (a quinone diazide compound) was spin-coated on the 1μm thick photoresist film. The film was dried at 80° C. for 20 minutes to obtain a two-layered photoresist structure. This structure was exposed to light in a reduction projection type exposure apparatus supplied by Canon Inc. The exposed structure was developed with a 5% aqueous solution of tetramethylammonium hydroxide. The substrate was etched by reactive sputter etching apparatus under the above etching conditions. As a result, a 0.6-μm pattern was formed with sharp edges. No pattern transfer difference was observed when the pattern was transferred onto a thick organic layer.

Suitable sensitizers for the polymers of the present invention include o-benzo quinone diazide, o-naptho quinone diazide, and p-benzo quinone diazide.

It should be evident that various modifications can be made to the described embodiments without departing from the scope of the present invention.

We claim as our invention:

1. A positive photoresist comprising an admixture of a photo-sensitive O-quinone diazide and a polymer having at least one recurring unit represented by the following general formula:

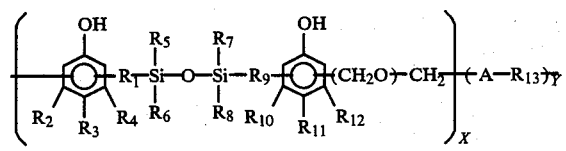

wherein $R_1$ and $R_9$ are each lower alkalene groups; $R_2$ and $R_3$, $R_4$, $R_{10}$, $R_{11}$, and $R_{12}$ each are H, OH, CH$_3$, or CH$_2$OH; $R_5$ to $R_8$ are each lower alkyl groups; $R_{13}$ is CH$_2$ or CH$_2$OCH$_2$; p is 0 or 1; A is phenol or a substituted phenol having substituents in the o-, m-, or p-, positions relative to the hydroxyl or A is:

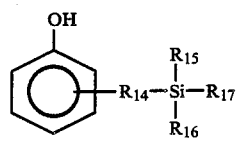

wherein $R_{14}$ is a lower alkalene group, $R_{15}$, $R_{16}$ and $R_{12}$ are each lower alkyl groups, X is greater than 0.3 but less than 1.0, and Y is not more than 0.7;

and wherein the O-quinone diazide and polymer are present in sufficient quantity amounts in the photoresist material when used in a coating on substrate that upon a pattern exposure to ultra-violet radiation and subsequent development a resist pattern is formed.

* * * * *